(12) United States Patent
Inazumachi et al.

(10) Patent No.: US 6,693,789 B2
(45) Date of Patent: Feb. 17, 2004

(54) SUSCEPTOR AND MANUFACTURING METHOD THEREOF

(75) Inventors: Hiroshi Inazumachi, Funabashi (JP); Takeshi Ootsuka, Funabashi (JP); Takeshi Kawase, Funabashi (JP)

(73) Assignee: Sumitomo Osaka Cement Co., Ltd., Funabashi (JP)

( * ) Notice: Subject to any disclaimer, the term of this patent is extended or adjusted under 35 U.S.C. 154(b) by 249 days.

(21) Appl. No.: 09/825,860

(22) Filed: Apr. 3, 2001

(65) Prior Publication Data

US 2002/0006678 A1 Jan. 17, 2002

(30) Foreign Application Priority Data

Apr. 5, 2000 (JP) .................................... 2000-103665
Apr. 19, 2000 (JP) .................................... 2000-118582

(51) Int. Cl.[7] ............................................. H02N 13/00
(52) U.S. Cl. ......................................... 361/234; 29/829
(58) Field of Search ..................... 361/234; 279/128; 428/545, 689, 698; 29/25.01, 829, 564, 738, 739, 744, 746

(56) References Cited

U.S. PATENT DOCUMENTS 5,800,618 A * 9/1998 Niori et al. .................. 118/723
6,204,489 B1 * 3/2001 Katsuda et al. ............. 118/725
6,215,643 B1 * 4/2001 Nagasaki ..................... 361/234

FOREIGN PATENT DOCUMENTS

| JP | 04300136 A | 10/1992 | ........... H01L/21/68 |
| JP | 06151044 A | 5/1994 | ............ H05B/3/20 |
| JP | 06151332 A | 5/1994 | ......... H01L/21/205 |
| JP | 06115528 | 6/1995 | ......... H01L/21/205 |
| JP | 10189696 A | 7/1998 | ........... H01L/21/68 |

* cited by examiner

Primary Examiner—Ronald W. Leja

(57) ABSTRACT

A built-in electrode type susceptor having excellent corrosion resistance and plasma resistance is obtained. A placement plate and a support plate made of ceramics are prepared, fixation holes are formed in this support plate, and feeding terminals consisting of a conductive composite ceramics are fitted into these fixation holes so as to penetrate through the support plate. A conductive material layer consisting of a conductive composite ceramics is formed on this support plate so as to come into contact with the feeding terminals, and the support plate and the placement plate are overlapped on each other via the conductive material layer on the support plate, and subjected to sintering and heat treatment under application of pressure, to thereby integrate these plates. Also, the conductive material layer is used as an internal electrode consisting of a conductive composite ceramics sintered body, to thereby obtain a built-in electrode type susceptor. At the time of overlapping and bonding the placement plate and the support plate, these may be bonded via a nonconductive layer having the same material as these plates.

10 Claims, 2 Drawing Sheets

PRIOR ART

SUSCEPTOR AND MANUFACTURING METHOD THEREOF

BACKGROUND OF THE INVENTION

1. Field of the Invention

The present invention relates to a susceptor and a manufacturing method thereof. More specifically, the present invention relates to a susceptor capable of reliably charging electricity to an inner electrode built in the susceptor, and a manufacturing method of the susceptor, which can manufacture the susceptor at high yield and at a low price.

2. Description of the Related Art

In a dry etching apparatus or a CVD apparatus used in the manufacturing process of semiconductors such as ICs, LSIs, or VLSIs, in order to evenly perform film formation by means of etching or CVD for each wafer, single wafer processing has been recently developed wherein a plate sample such as a semiconductor wafer, a liquid crystal substrate glass or a printed board is processed one by one. In this single wafer processing process, in order to hold the plate samples one at a time in a processing chamber, the plate sample is mounted on a sample stand (pedestal) referred to as a susceptor, and subjected to predetermined processing.

This susceptor must endure use in plasma, and also must endure use at high temperatures. Hence it is required to have excellent plasma resistance and large heat conductivity.

As such a susceptor, one consisting substantially of a ceramics sintered body with excellent plasma resistance and heat conductivity is used.

These susceptors include ones provided with an internal electrode such as an electrostatic chuck electrode for generating an electric charge thereinside for securing a plate sample with electrostatic attraction, a heater electrode for energizing with electricity and generating heat to heat the plate sample, or a plasma generating electrode for energizing with high-frequency power to generate plasma for plasma processing.

FIG. 3 shows one example of a susceptor having such an internal electrode built therein. The susceptor 15 comprises a placement plate 11 for placing a plate sample (not shown) thereon, a support plate 13 for supporting this placement plate 11, an internal electrode 12 clamped and held between this placement plate 11 and the support plate 13, and feeding terminals 14 inserted in the support plate 13 so as to come in contact with the internal electrode 12, for supplying electric current to the internal electrode 12.

As a manufacturing method of such susceptors 15, there can be mentioned, for example, a method wherein fixation holes 16 for connecting the feeding terminals 14 to the internal electrode 12 are formed beforehand in the support plate 13, feeding terminals 14 made of metal are mounted in these fixation holes 16, an internal electrode 12 comprising a refractory metal such as tungsten, tantalum or molybdenum is arranged between the support plate having these feeding terminals 14 and the placement plate 11, and these are bonded by various binders under application of pressure.

In the manufacturing method of such a susceptor 15, however, at the time of bonding the placement plate 11 and the support plate 13 having the feeding terminals 14, it is difficult to approximate the coefficient of thermal expansion of the placement plate 11 and the support plate 13 to that of the feeding terminals 14. Also, it is necessary to use a refractory metal such as tungsten, tantalum or molybdenum, which has a high heat resistance and is expensive, for the metal forming the feeding terminals 14.

Moreover, at the time of high-temperature bonding under application of pressure, since the Young's modulus of the feeding terminals 14 made of metal and the Young's modulus of the placement plate 11 and the support plate 13 are very different, if a large pressure is applied, these fracture due to a difference in the deformation modulus. Therefore, these cannot be pressed sufficiently, and the electrical connection between the feeding terminals 14 and the internal electrode 12 is thus not sufficient, or a gap occurs between the internal electrode 12 and the placement plate 11. As a result, depending on the application of the internal electrode 12, the electrostatic attractive force decreases, the heater heating performance decreases, or plasma is not generated on the placement plate 11. Furthermore, the binder is exposed so that the constituents thereof volatilize and disperse, thereby contaminating the plate sample.

Therefore, in order to solve these problems, as a method of forming an internal electrode 12 in the susceptor 15 there is generally adopted a manufacturing method wherein, for example, a conductive paste in which an electrode material serving as the internal electrode 12 dispersed in an organic solvent or the like is printed on a support plate 13 in a predetermined pattern, and after the support plate 13 and a placement plate 11 are overlapped on each other and sintered and integrally formed via a surface on which the conductive paste comprising the electrode material is printed, fixation holes 16 are bored in the support plate 13 so as to reach the internal electrode 12, in order to form a conductive circuit between the internal electrode 12 and the outside of the susceptor 15, metallic feeding terminals 14 are mounted in these holes, and the metallic feeding terminals 14 and the internal electrode 12 are bonded via a brazing filler metal.

As another conventional built-in electrode type susceptor, there can be mentioned a susceptor comprising; a placement plate 11 for placing a plate sample thereon, a support plate 13 for supporting this placement plate 11, a conductive binder layer serving as an internal electrode 12 and integrally bonding the placement plate 11 and the support plate 13, and feeding terminals 14 buried in the support plate 13 so as to come in contact with the conductive binder layer, for feeding electric current to the internal electrode 12. The placement plate 11 comprises a dielectric made of a nonconductive ceramics sintered body, the support plate 13 comprises a substrate made of a nonconductive ceramics sintered body, and the conductive bond layer is formed of organic matter or metal.

In this kind of built-in electrode type susceptor 15, however, as described above, since the placement plate 11 and the support plate 13 are bonded by the conductive binder layer comprising a different material, bonding between the placement plate 11 and the support plate 13 is insufficient. Hence, corrosive gas or plasma enters in from the boundary therebetween, so that there is a possibility that the internal electrode 12 may be exposed to the gas or plasma, or that the bonding interface between the placement plate 11 and the support plate 13 may be broken, thereby causing a problem in that the corrosion resistance and the plasma resistance of the susceptor 15 is not sufficient.

In order to solve these problems, in the conventional manufacturing method of susceptors 15, it is necessary to ensure the bonding between the placement plate 11 and the susceptor 13, so that any gas or plasma does not enter into the junction.

As means for solving these problems, for example as shown in FIG. 4 and FIG. 5, there has been considered a method in which the above described placement plate 21 is structured with a ring-shape flange 21a provided on the side margin thereof to thereby form a disc-like concave portion 21b, and a support plate 23 having a conductive bond layer serving as an internal electrode 22 and a feeding terminal 24 built therein, is assembled into the concave portion 21b of the placement plate 21. In this method, however, it is necessary to design the placement plate 21 in a shape having the above structure, and to design the conductive bond layer and the support plate 23 in a shape so as to fit into the concave portion 21b of the placement plate 21 without any gap. As a result, there is a problem in that the manufacturing process of the susceptor 25 becomes complicated.

As described above, in the manufacturing method of susceptors 25 in which after bonding the placement plate 21 and the support plate 23, the fixation hole is formed by boring, however, the boring operation for the hole for mounting the feeding terminals 24 is performed from the surface of the support plate 23, and the formation of the hole must be stopped accurately at the surface contacting with the internal electrode 22. Moreover, it is required that the internal electrode 22 and the feeding terminals 24 be satisfactorily brought into contact with each other and electrically bonded completely. When the hole does not reach the internal electrode 22, or when the internal electrode 22 has been penetrated through, the electrical bonding becomes imperfect, so that the internal electrode 22 is unreliably charged with electricity.

Moreover, the thickness of the internal electrode 22 is normally of an order of several tens of $\mu$m. Therefore the boring operation becomes a very inefficient operation, since work must be performed at a boring speed less than an order of the thickness of the internal electrode 22. Also, since the stop position cannot be accurately determined, this also becomes a cause for a decrease in the work yield.

Furthermore, as in the case where the internal electrode 22 is a bipolar type electrostatic chuck electrode, in the case where the position of the feeding terminals 24 on the pattern plane of the internal electrode 22 is important, it is necessary to perform the boring operation carefully, while monitoring the boring position using an X-ray transmission apparatus or the like. Hence, the operation needs time and effort.

As described above, there is heretofore no adequate susceptor 25 having the internal electrode 22 and the feeding terminals 24 formed therein in an accurate position and capable of reliably energizing the internal electrode 22, nor an adequate susceptor manufacturing method capable of manufacturing such a susceptor 25 at high yield and at a low price.

In view of the above problems, it is a specific object of the present invention to provide susceptors capable of reliably energizing an internal electrode formed therein, and a susceptor manufacturing method which can provide a built-in electrode type susceptor having excellent corrosion resistance and plasma resistance, in which corrosive gas or plasma does not enter into the susceptor from the bonding surface between a placement plate and a support plate, as well as being capable of providing such a built-in electrode type susceptor easily, at high yield and at a low price.

SUMMARY OF THE INVENTION

The present inventors have conducted a keen study for solving the above problems, and have developed a method for obtaining a built-in electrode type susceptor by boring a fixation hole in a support plate, fitting a feeding terminal to the support plate having this fixation hole, and after forming a conductor serving as an internal electrode beforehand, overlapping this with a placement plate on the support plate and performing sintering and bonding to integrate these plates. At this time, by selecting and combining a specific material for each member of the placement plate, the support plate, the internal electrode and the feeding terminal, all the problems that the conventional susceptor has can be solved, and susceptors having excellent corrosion resistance and plasma resistance can be provided at a low price.

That is to say, the invention according to a first aspect is a built-in electrode type susceptor comprising a placement plate for placing a plate sample thereon, a support plate for supporting this placement plate, an internal electrode provided between these placement plate and support plate so as not to come in contact with the outside, and a feeding terminal provided penetrating through the support plate so as to come in contact with the internal electrode, wherein the placement plate and the support plate are integrally bonded by a nonconductive material having the same composition or the same main component as that of the material constituting these plates.

By making a susceptor having such a construction, there is an advantage in that susceptors excellent in corrosion resistance and plasma resistance can be obtained.

The invention according to a second aspect is a built-in electrode type susceptor comprising a placement plate for placing a plate sample thereon, a support plate for supporting this placement plate, an internal electrode provided between these placement plate and support plate so as not to come in contact with the outside, and a feeding terminal provided penetrating through the support plate so as to come in contact with the internal electrode, wherein the internal electrode and the feeding terminal are formed of a conductive ceramics.

By making a susceptor having such a construction, there is an advantage in that a choice of specific resistance is widened, and an internal electrode having optimum specific resistance can be easily obtained, depending on the function aimed at by the internal electrode.

The invention according to a third aspect is a built-in electrode type susceptor wherein the conductive ceramics is any one kind of composite ceramics conductors selected from an alumina-tantalum carbide composite ceramics conductor, an alumina-tungsten composite ceramics conductor, an alumina-silicon carbide composite ceramics conductor, an aluminum nitride-tungsten composite ceramics conductor, or an aluminum nitride-tantalum composite ceramics conductor.

By making a susceptor having such a construction, there is an advantage in that the specific resistance of the internal electrode can be chosen in a wide range of from $1 \times 10^{-5}$ to $1 \times 10^{5}$.

The invention according to a fourth aspect is a built-in electrode type susceptor, wherein the alumina-tantalum carbide composite ceramics conductor has a material containing tantalum in an amount of from 54 to 71% by weight.

The invention according to a fifth aspect is a built-in electrode type susceptor, wherein the alumina-tungsten composite ceramics conductor has a material containing tungsten in an amount of from 54 to 95% by weight.

The invention according to a sixth aspect is a built-in electrode type susceptor, wherein the alumina-silicon carbide composite ceramics conductor has a material containing silicon carbide in an amount of from 5 to 30% by weight.

By using the composite ceramics conductor of such a material, it becomes possible to obtain an internal electrode and a feeding terminal having an adequate specific resistance and adequate coefficient of thermal expansion and Young's modulus. As a result, there is an advantage in that the occurrence of a thermal stress fracture can be suppressed to increase the product yield, and the product can be provided at a low price.

The invention according to a seventh aspect is a built-in electrode type susceptor, wherein the placement plate and the support plate comprise an alumina group sintered body or an aluminum nitride sintered body.

By making a susceptor having such a construction, there is an advantage in that susceptors strong against a thermal shock and excellent in corrosion resistance and plasma resistance can be obtained.

The invention according to an eighth aspect relates to a susceptor manufacturing method comprising steps of: preparing a plate-like placement plate and support plate from a ceramics sintered body; forming a fixation hole for fixing a feeding terminal in the support plate; fitting the feeding terminal in the fixation hole so as to penetrate through the support plate; forming a conductive material layer serving as an internal electrode on the support plate holding the feeding terminal, so as to come in contact with the feeding terminal; overlapping the support plate and the placement plate on each other via the conductive material layer, and subjecting these to sintering processing under application of pressure to thereby integrate these plates; and forming an internal electrode consisting of the conductive material layer between these support plate and placement plate.

By having a susceptor manufacturing method involving such steps, there is the advantage that susceptors can be provided at a low price by a simple method.

The invention according to a ninth aspect is a susceptor manufacturing method, wherein when the support plate and the placement plate are overlapped on each other, a nonconductive material layer comprising a powdery material having the same composition or the same main component as that of the ceramics sintered body constituting the placement plate and the support plate, is formed in an area other than the area where the conductive material layer is formed on the support plate.

By having a susceptor manufacturing method involving such steps, since the nonconductive material layer is provided in the interface between the placement plate and the support plate to integrally bond these plates, there is an advantage in that susceptors excellent in the corrosion resistance and the plasma resistance can be easily obtained. Moreover, the surface shape of the placement plate and the support plate is not required to be machined to a complicated shape, and need only be made to a simple plate form. As a result, it becomes possible to provide susceptors at high yield and at a low price.

The invention according to a tenth aspect is a susceptor manufacturing method, wherein as the conductive material serving as the internal electrode or the feeding terminal, any one kind selected from an alumina-tantalum carbide composite ceramics conductive material, an alumina-tungsten composite ceramics conductive material, an alumina-silicon carbide composite ceramics conductive material, an aluminum nitride-tungsten composite ceramics conductive material, an aluminum nitride-tantalum composite ceramics conductive material, or a high melting metal is used.

By having a susceptor manufacturing method involving such steps, there is an advantage in that materials having adequate specific resistance can be selected and combined.

PREFERRED EMBODIMENTS

The present invention will now be described in detail, by way of embodiments of the present invention. The embodiments of the present invention in no way limit the contents of the invention, unless otherwise specified.

(First Embodiment)

Figure 1:
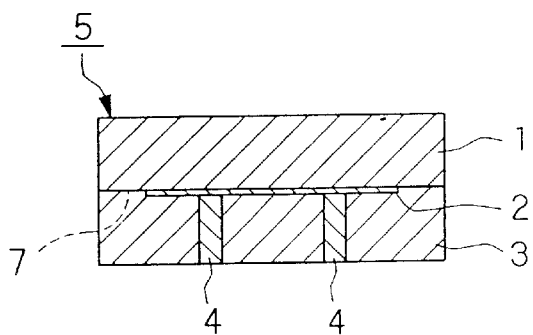
FIG. 1 is a sectional view showing one example of a susceptor of the present invention.

FIG. 1 shows one example of a first embodiment of a susceptor of the present invention.

A susceptor 5 comprises a placement plate 1 for placing a plate sample thereon, a support plate 3 integrated with the placement plate 1, an internal electrode 2 formed between the placement plate 1 and the support plate 3, and feeding terminals 4 leading to the internal electrode 2 and provided so as to penetrate through the inside of the support plate 3.

The placement plate 1 and the support plate 3 are integrally bonded by a nonconductive material layer 7 having the same composition or the same main component as that of the materials constituting these plates.

The placement plate 1 and the support plate 3 have their overlapped surfaces in the same shape, both consisting of a nonconductive ceramics sintered body such as an alumina group sintered body or an aluminum nitride group sintered body.

The alumina group sintered body or the aluminum nitride group sintered body described above are not particularly limited, and may be those generally sold in the market.

Also, the alumina group sintered body or the aluminum nitride group sintered body may contain one kind or two or more kinds selected from yttria ($Y_2O_3$), calcia (CaO), magnesia (MgO), silicon carbide (SiC) and titania ($TiO_2$), in an amount of from 0.1 to 10.0% by weight, in order to improve the degree of sintering and the plasma resistance.

The above described nonconductive material layer 7 is provided for bonding the boundary between the placement plate 1 and the support plate 3, that is, the outer peripheral area other than the area where the internal electrode 2 is formed. The nonconductive material layer comprises the same powdery nonconductive material as the placement plate 1 and the support plate 3, or a powdery nonconductive material having the same main component.

Here, the "material having the same main component" stands for a material containing materials other than the material constituting the placement plate 1 and the support plate 3 in an amount of not more than 50% by weight, and for example, when the placement plate 1 and the support plate 3 are formed of aluminum nitride, the material contains components other than aluminum nitride in an amount of not more than 50% by weight.

When a material having the same component as that of the placement plate 1 and the support plate 3 is used as the nonconductive material layer 7, after formation of the susceptor, the boundary between the placement plate 1 and the support plate 3 disappears and the plates are integrated.

The above described internal electrode 2 is used as an electrostatic chuck electrode for generating an electric charge for securing a plate sample with electrostatic attraction, a heater electrode for energizing with electricity and generating heat to heat the plate sample, or a plasma generating electrode for energizing with high-frequency power to generate plasma for plasma processing, and the shape and size thereof is appropriately adjusted depending on the application thereof.

This internal electrode 2 is formed of conductive ceramics such as an alumina-tantalum carbide composite conductive ceramics material, an alumina-tungsten composite conductive ceramics material, an alumina-silicon carbide composite conductive ceramics material, an aluminum nitride-tungsten composite conductive ceramics material, or an aluminum nitride-tantalum composite conductive ceramics material, or refractory metals such as tungsten, tantalum or molybdenum.

Of these conductive composite ceramics sintered bodies, the alumina-tantalum carbide conductive composite ceramics sintered body and the alumina-tungsten conductive composite ceramics sintered body have a particularly low specific resistance ($1\times10^{-1}$ to $1\times10^{-5}$ Ωcm). Therefore, these are preferably used as an electrostatic chuck electrode, a heater electrode for energizing with electricity and generating heat to heat the plate sample, and a plasma generating electrode for energizing with high-frequency power to generate plasmas for plasma processing.

On the other hand, the alumina-silicon carbide conductive composite ceramics sintered body has a higher specific resistance ($1\times10^{4}$ to $1\times10^{5}$ Ωcm) than other conductive composite ceramics sintered bodies, and hence is preferably used for an electrostatic chuck electrode and a heater electrode for energizing with electricity and generating heat to heat the plate sample.

The above described alumina-tantalum carbide conductive composite ceramics sintered body desirably contains tantalum carbide in an amount of 54 to 71% by weight. The reason why the content of tantalum carbide is set to be 54 to 71% by weight is that if the content thereof is less than 54% by weight, the resistance value of the internal electrode 2 increases and thus cannot function as the internal electrode 2, and if the content exceeds 71% by weight, the coefficient of thermal expansion of the internal electrode 2 differs largely from the alumina group sintered body forming the placement plate 1 and the support plate 3, resulting in thermal stress fracture due to the pressing-heating processing in the post-processing.

Moreover, the above described alumina-tungsten conductive composite ceramics sintered body desirably contains tungsten in an amount of 54 to 95% by weight. The reason why the content of tungsten is set to be 54 to 95% by weight is that if the content thereof is less than 54% by weight, the resistance value of the internal electrode 2 increases and thus cannot function as the internal electrode 2, and if the content exceeds 95% by weight, the coefficient of thermal expansion of the internal electrode 2 differs largely from the alumina group sintered body forming the placement plate 1 and the support plate 3, resulting in thermal stress fracture due to the pressing-heating processing in the post-processing.

Also, the above described the alumina-silicon carbide conductive composite ceramics sintered body desirably contains silicon carbide in an amount of 5 to 30% by weight. The reason why the content of silicon carbide is set to be 5 to 30% by weight is that if the content thereof is less than 5% by weight, the resistance value of the internal electrode 2 increases and thus cannot function as the internal electrode 2, and if the content exceeds 30% by weight, the coefficient of thermal expansion of the internal electrode 2 differs largely from the alumina group sintered body forming the placement plate 1 and the support plate 3, resulting in thermal stress fracture due to the pressing-heating processing in the post-processing.

The above feeding terminals 4 are provided for feeding electric current to the internal electrode 2, and the number, shape and size thereof are determined in accordance with the shape of the internal electrode 2 and the mode (that is, which type of the electrostatic chuck electrode, the heater electrode or the plasma generating electrode, is the internal electrode 2).

The feeding terminal 4 consists of a composite conductive ceramics sintered body obtained by subjecting a conductive ceramics material powder forming the internal electrode 2 to pressure sintering, or is formed of a sintered body or a casting of a refractory metal such as tantalum, tungsten or molybdenum.

When the feeding terminal 4 is formed of a composite ceramics conductor, for example, a powder mixture of an alumina powder and a tantalum carbide powder, a powder mixture of an alumina powder and a tungsten powder, a powder mixture of an alumina powder and a silicon carbide powder, a powder mixture of an aluminum nitride powder and a tungsten powder, or a powder mixture of an aluminum nitride powder and a tantalum powder is used. After these powder mixtures have been molded, the molded powders are subjected to pressure sintering to thereby obtain feeding terminals 4 consisting of the conductive composite ceramics sintered body. It is desirable that the material is the same as that of the internal electrode 2, from the standpoint of bonding with the internal electrode, and it is preferred to use a material having a low specific resistance from the standpoint of conductivity.

In particular, since the alumina-tantalum carbide conductive composite ceramics sintered body and the alumina-tungsten conductive composite ceramics sintered body have a sufficiently low specific resistance as described above, high-power can be applied on the internal electrode 2. This is ideal because high density plasma can be generated when the internal electrode 2 is used as the plasma generating electrode.

It is desirable from the standpoint of electrical connection to form the internal electrode 2 and the feeding terminals 4 using the same material, but it is also possible to use different materials so as to have a low resistance.

As described above, according to the susceptor of the present invention, since any corrosive gas or plasma does not enter into the susceptor from the bonding surface between the placement plate and the support plate, the bonding interface thereof is not broken, and the internal electrode is not exposed to the gas or plasma. Hence a susceptor having excellent corrosion resistance and plasma resistance can be obtained.

Moreover, if a conductive composite ceramics sintered body is used for the internal electrode and the feeding terminals of the susceptor, thermal stress fracture due to a difference in the coefficient of thermal expansion between respective members at the time of manufacturing can be prevented. As a result, the internal electrode and the feeding terminals can be reliably and strongly connected, thereby ensuring higher reliability at the time of energizing with electricity.

Next, a manufacturing method of such a susceptor 5 will be described.

FIG. 2 shows a manufacturing process of the susceptor 5.

At first, a plate-like placement plate 1 and support plate 3 are prepared from a nonconductive ceramics sintered body such as an alumina group sintered body or an aluminum nitride group sintered body. In this case, the placement plate 1 and the support plate 3 can be obtained by molding the above described nonconductive ceramics material powder into a desired shape and sintering.

At this time, one side of the placement plate 1 (the surface on which a plate sample is placed) is desirably polished so that the flatness becomes 10 μm or less.

Subsequently, fixation holes 6 are formed in the support plate 3 for assembling and holding the feeding terminals 4 beforehand. The method of boring the fixation holes 6 is not particularly limited, and for example, a drilling method using a diamond drill, laser processing, an electrodischarge machining process or an ultrasonic machining process may be used for boring the hole. The machining accuracy thereof may be normal machining accuracy, and machining can be performed substantially at a yield of 100%.

The boring position and number of the fixation holes 6 are determined depending on the mode and shape of the internal electrode 2.

Then, the feeding terminals 4 are prepared so as to have a size and a shape that can be fixed in close contact in the fixation holes 6 in the support plate 3.

When the feeding terminals 4 are made of a conductive ceramics sintered body, the preparation method of the feeding terminals 4 includes a method in which a powder of a conductive ceramics material is molded in a desired shape and subjected to pressure sintering. At this time, the conductive ceramics material powder used for the feeding terminals 4 is desirably one formed of the same material as that of the internal electrode 2 formed in the susceptor 5. Also, when the feeding terminals 4 are made of metal, a high melting metal such as tantalum, tungsten or molybdenum is used to form the feeding terminals by conventionally known techniques in metal processing such as grinding, casting and powder metallurgy.

The machining accuracy of the feeding terminals 4 may have a clearance at the standard tolerance level of Japan Industrial Standard (JIS), since these are refired and fixed in the post pressing-heating processing.

Then, the prepared feeding terminals 4 are fitted into the fixation holes 6 in the support plate 3.

Subsequently, a coating agent for forming the internal electrode, in which a conductive material powder such as the above described conductive ceramics or refractory metal is dispersed in an organic solvent such as ethyl alcohol, is coated on a predetermined area on the surface of the support plate 3 having the feeding terminals assembled therein, so as to come in contact with the feeding terminals 4, and is then dried to form an internal electrode forming layer 2'. Since coating should be performed in a uniform thickness, it is desirable to use a screen printing method or doctor blade method, as the coating method of such a coating agent.

As other methods, there can be mentioned a method in which a thin plate of the above described conductive ceramics or refractory metals is arranged in a prescribed location to form the internal electrode forming layer 2', or a method of forming a thin film such as a vapor deposited film of the refractory metal described above. When such a thin film or thin plate is arranged in a prescribed location, it is necessary to bring this into strong contact with the feeding terminals 4.

Moreover, in order to improve nonconductivity, corrosion resistance and plasma resistance, a nonconductive material layer 7 containing a powdery material having the same composition or the same main component as that of the materials constituting the placement plate 1 and the support plate 3 is formed in an area other than the area on the support plate 3 where the internal electrode forming layer 2' is formed.

In order to form this nonconductive material layer 7, for example, when the placement plate 1 and the support plate 3 are formed of an alumina group sintered body, a coating agent containing an alumina powder dispersed in an organic solvent such as ethyl alcohol is applied and dried. When the placement plate 1 and the support plate 3 are formed of an aluminum nitride group sintered body, a coating agent containing an aluminum nitride powder dispersed in an organic solvent such as ethyl alcohol is applied on the above described predetermined region by a screen printing method or doctor blade method and dried.

Next, the placement plate 1 is overlapped on the support plate 3 where the internal electrode forming layer 2' and the nonconductive material layer 7 are formed, via the internal electrode forming layer 2' and the nonconductive material layer 7, and these are subjected to heat treatment under application of pressure and thus integrated.

In such a manufacturing method, bonding integration of the placement plate 1 and the support plate 3 can be achieved by only the heat treatment for sintering these under application of pressure, without inclusion of a bonding material of different materials comprising organic substances or metals between the support plate 3 and the placement plate 1.

As the conditions for sintering heat treatment at this time, the heat treatment atmosphere is desirably an inert atmosphere such as vacuum, Ar, He or $N_2$. The woking pressure is desirably from 5 to 10 MPa, and the heat treatment temperature is desirably from 1600 to 1850° C.

At this time, when the internal electrode forming layer 2' formed on the support plate 3 comprises a conductive material such as a conductive ceramics powder or the like, the internal electrode forming layer 2' is sintered to thereby form an internal electrode 2 made of a conductive composite ceramics sintered body. Also, the support plate 3 and the placement plate 1 are integrally bonded via the nonconductive material layer 7. Moreover, the feeding terminals 4 are resintered by heat treatment under application of pressure and fixed into the fixation holes 6 in the support plate 3.

According to such a susceptor manufacturing method, a nonconductive material layer 7 comprising a nonconductive material having the same composition or the same main component as that of the material constituting the placement plate 1 and the support plate 3 is provided on the bonding surface between the placement plate 1 and the support plate 3, and the placement plate 1 and the support plate 3 are integrally bonded by means of this nonconductive material layer 7. Therefore, any gas or plasma does not enter into the susceptor 5 from the bonding interface between the placement plate 1 and the support plate 3, and hence the internal electrode 2 is not exposed thereto. As a result, the bonding interface between the placement plate 1 and the support plate 3 is not broken, and the built-in internal electrode 2 does not cause abnormal discharge or fracture, thereby enabling improvement in the corrosion resistance and the plasma resistance of the susceptor 5.

Furthermore, according to the susceptor manufacturing method of the present invention in which a nonconductive material layer is provided on the boundary surface of the placement plate and the support plate and these are integrally bonded, the support plate 3 and the placement plate 1 are well bonded and integrated by the nonconductive material layer 7. Therefore, a special design is not necessary for the shapes thereof as before, and these plates can have a simple plate-like shape. As a result, a susceptor 5 having excellent corrosion resistance and plasma resistance can be manufactured easily at high yield and at a low price.

(Second Embodiment)

In a second embodiment, the point different from the first embodiment is that the nonconductive material layer 7 is not used for bonding the placement plate 1 and the support plate 3, and the placement plate 1 and the support plate 3 are directly overlapped on each other and subjected to pressure sintering, to thereby effect bonding and integration. In either case of the first embodiment and the second embodiment, after sintering, the bonding surface of the placement plate 1 and the support plate 3 are integrated and no boundary can be observed.

Other members such as the placement plate 1, the internal electrode 2, the support plate 3, and the feeding terminals 4 are all the same as in the first embodiment.

The susceptor of the present invention has high reliability in energizing with electricity, since the feeding terminal is reliably and strongly connected to the internal electrode.

With the susceptor manufacturing method in the second embodiment, in order to reliably bond the placement plate 1 and the support plate 3, it is desirable that a shallow depressions are formed in the area where the internal electrode forming layer 2' is applied, and after the internal electrode 2 is formed, the placement plate 1 and the support plate 3 are brought into direct contact with each other. Conditions for pressure sintering may be the same as in the first embodiment.

According to the susceptor manufacturing method of the present invention, susceptors having the above described excellent properties can be manufactured at high yield and at a low price, without performing advanced post-machining.

EXAMPLES

The present invention will now be described in detail by way of examples.

In the following examples, the present invention will be further explained by way of examples for the case where the internal electrode 2 shown in FIG. 1 is an electrostatic chuck electrode.

Example 1

[Preparation of the Feeding Terminals]

40 parts by weight of alumina powder (average particle diameter: 0.2 $\mu$m, manufactured by Daimei Kagaku Kogyo Co., Ltd.), 60 parts by weight of tantalum carbide powder (average particle diameter: 1 $\mu$m, manufactured by Nippon Shinkinzoku Co., Ltd.), and 150 parts by weight of isopropyl alcohol were mixed together, and uniformly dispersed using a planetary-type ball mill, to thereby obtain a slurry.

From this slurry, the alcohol component was removed by suction filtration, and the slurry was dried to obtain an alumina-tantalum carbide composite powder.

Then, the above composite powder was molded and sintered, to thereby obtain a cylindrical alumina-tantalum carbide conductive composite ceramics sintered body having a diameter of 2.5 mm and a length of 5 mm, and this was used as the feeding terminal 4. Sintering was performed under application of pressure by a hot press under conditions of a temperature of 1700° C. and a pressure of 20 MPa. The relative density of the sintered alumina-tantalum carbide conductive composite ceramics sintered body was 98% or higher.

[Preparation of the Support Plate]

Alumina powder (average particle diameter: 0.2 $\mu$m, manufactured by Daimei Kagaku Kogyo Co., Ltd.) was molded and sintered, to obtain a disc-like alumina sintered body (support plate 3) having a diameter of 230 mm, and a thickness of 5 mm. The conditions at the time of sintering were the same as those of at the time of preparing the feeding terminal 4.

Figure 2A:
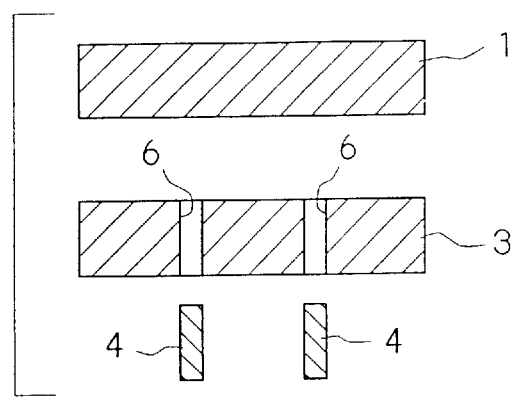
FIG. 2A is a process drawing showing one example of a susceptor manufacturing method according to the present invention.

Then, as shown in FIG. 2A, fixation holes 6 for assembling and fixing the feeding terminals 4 were bored in this alumina sintered body by drilling with a diamond drill, to thereby obtain a support plate 3 made of an alumina sintered body.

[Preparation of the Placement Plate]

In accordance with the preparation method of the above described support plate 3 made of an alumina group sintered body, a disc-like alumina group sintered body having a diameter of 230 mm and a thickness of 5 mm was obtained. Then, one side of this disc-like alumina group sintered body (the surface on which a plate sample is placed) was polished so that the flatness became 10 $\mu$m or less, to thereby obtain a placement plate 1 made of an alumina group sintered body.

[Integration]

The above feeding terminals 4 were pushed into, and assembled and fixed in the fixation holes 6 bored in the support plate 3.

Figure 2B:
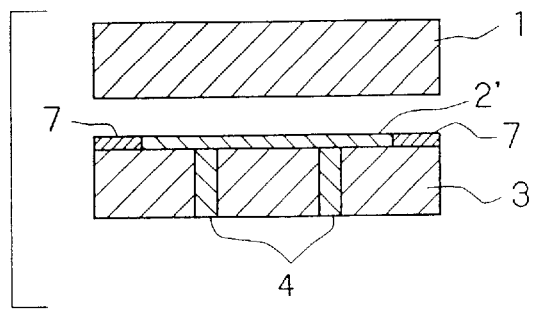
FIG. 2B is a process drawing following FIG. 2A.

Then, as shown in FIG. 2B, a coating agent comprising an alumina-tantalum carbide composite conductive ceramics material containing 40% by weight of alumina powder and 60% by weight of tantalum carbide powder was printed and coated by a screen printing method on the support plate 3 having the feeding terminals 4 assembled and fixed therein, so as to form an internal electrode 2 in the subsequent heat treatment process under application of pressure, and dried to thereby form an internal electrode forming layer 2'.

Subsequently, a coating agent comprising alumina powder (average particle diameter: 0.2 $\mu$m, manufactured by Daimei Kagaku Kogyo Co., Ltd.) and ethyl alcohol was printed and coated by the screen printing method on an area other than the area where the internal electrode 2 was formed on the support plate 3, and dried to thereby form a nonconductive material layer 7.

Figure 2C:
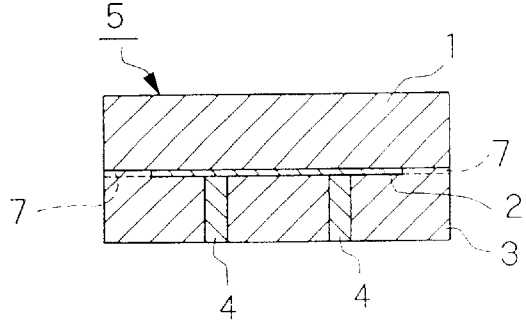
FIG. 2C is a process drawing following FIG. 2B.
Figure 3:
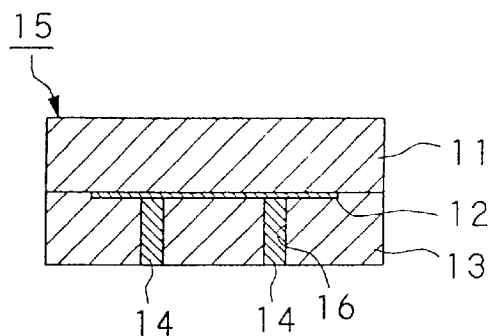
FIG. 3 is a sectional view showing one example of a conventional susceptor.
Figure 4:
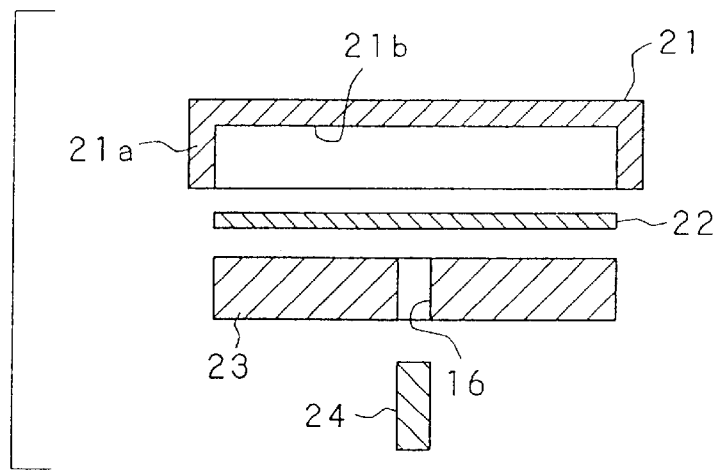
FIG. 4 is a sectional view showing the shape of a placement plate and a support plate in one example of a conventional susceptor.
Figure 5:
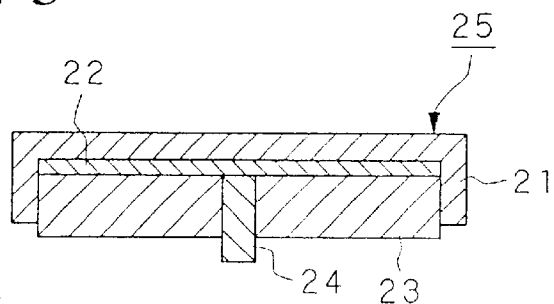
FIG. 5 is a sectional view of the conventional susceptor in FIG. 4.

Then, as shown in FIG. 2C, the support plate 3 and the placement plate 1 were overlapped on each other so as to put the internal electrode forming layer 2' (the printed face) and the nonconductive material layer 7 therebetween, and so that the polished surface of the placement plate 1 became the upper surface, and these were then heat treated under application of pressure by a hot press and integrated to thereby prepare the susceptor 5 in Example 1. The pressing and heating treatment conditions were such that the temperature was 1750° C. and the pressure was 7.5 MPa.

[Evaluation]

When the bonded section of the susceptor 5 prepared in this manner was observed by SEM, the placement plate 1, the support plate 3 and the feeding terminals 4 were bonded well.

Moreover, after the built-in electrode type susceptor 5 in this example had been exposed in a plasma of a gas mixture of $CF_4$ gas and $O_2$ gas for 15 hours, the surface properties of the susceptor 5 was observed visually, and changes in the surface roughness on the surface of the susceptor 5 on which a plate sample is placed and changes in the attraction force were measured. Any change in the surface properties were not observed, the surface roughness had hardly changed (Ra=0.12 $\mu$m before the test, Ra=0.13 $\mu$m after the test), and the attractive force had not changed (0.03 MPa before the test, 0.03 MPa after the test). As a result, it was found that the corrosion resistance and the plasma resistance were excellent.

Example 2

In this Example 2, the point different from the former Example 1 is that a nonconductive material layer 7 is not used for bonding the placement plate 1 and the support plate 3, the placement plate 1 and the support plate 3 being directly bonded. Other points are the same as in Example 1.

[Preparation of the Feeding Terminals]

40 parts by weight of alumina powder (average particle diameter: 0.2 µm, manufactured by Daimei Kagaku Kogyo Co., Ltd.), 60 parts by weight of tantalum carbide powder (average particle diameter: 1 µm, manufactured by Nippon Shinkinzoku Co., Ltd.), and 150 parts by weight of isopropyl alcohol were mixed together, and uniformly dispersed using a planetary-type ball mill, to thereby obtain a slurry.

From this slurry, the alcohol component was removed by suction filtration, and the slurry was dried to obtain an alumina-tantalum carbide composite powder.

Then, the above composite powder was molded and sintered, to thereby obtain a cylindrical alumina-tantalum carbide conductive composite ceramics sintered body, having a diameter of 2.5 mm and a length of 5 mm, and this was used as the feeding terminal 4. Sintering was performed under application of pressure by a hot press under conditions of a temperature of 1700° C. and a pressure of 20 MPa. The relative density of the sintered alumina-tantalum carbide conductive composite ceramics sintered body was 98% or higher.

[Preparation of the Support Plate]

Alumina powder (average particle diameter: 0.2 µm, manufactured by Daimei Kagaku Kogyo Co., Ltd.) was molded and sintered, to obtain a disc-like alumina sintered body (support plate 3) having a diameter of 230 mm and a thickness of 5 mm. The conditions at the time of sintering were the same as those of at the time of preparing the feeding terminal 4.

Then, fixation holes 6 for assembling and fixing the feeding terminals 4 were bored in this alumina sintered body by drilling with a diamond drill, to thereby obtain a support plate 3 made of an alumina sintered body.

[Preparation of the Placement Plate]

In accordance with the preparation method of the above described support plate 3 made of an alumina group sintered body, a disc-like alumina group sintered body having a diameter of 230 mm and a thickness of 5 mm was obtained. Then, one side of this disc-like alumina group sintered body (the surface on which a plate sample is placed) was polished so that the flatness became 10 µm or less, to thereby obtain a placement plate 1 made of an alumina group sintered body.

[Integration]

The above feeding terminals 4 were pushed into, and assembled and fixed in the fixation holes 6 bored in the support plate 3.

Then, as shown in FIG. 2B, a coating agent comprising an alumina-tantalum carbide composite conductive ceramics material containing 40% by weight of alumina powder and 60% by weight of tantalum carbide powder was printed and coated by the screen printing method on the support plate 3 having the feeding terminals 4 assembled and fixed therein, so as to form an internal electrode 2 in the subsequent heat treatment process under application of pressure, and dried to thereby form an internal electrode forming layer 2'. In this Example, the nonconductive material layer 7 shown in FIG. 2B was not used.

Then, as shown in FIG. 2C, the support plate 3 and the placement plate 1 were overlapped on each other so as to put the internal electrode forming layer 2' (the printed face) therebetween, and so that the polished surface of the placement plate 1 became the upper surface, and these were then heat treated under application of pressure by a hot press and integrated to thereby prepare the susceptor 5 in Example 2. The pressing and heating treatment conditions were such that the temperature was 1750° C. and the pressure was 7.5 MPa.

[Evaluation]

When the bonded section of the susceptor 5 prepared in this manner was observed by SEM, the placement plate 1, the support plate 3 and the feeding terminals 4 were bonded well.

Moreover, there was no occurrence of cracks in the bonded placement plate 1, support plate 3 and feeding terminals 4, and no peeling of the internal electrode 2 was observed.

Also, conduction between the feeding terminals 4 and the internal electrode 2 was excellent, and it was confirmed that these were reliably connected electrically.

Example 3

A susceptor 5 in Example 3 was obtained in the same manner as in Example 2, except that tungsten powder (average particle diameter: 0.5 µm, manufactured by Tokyo Tungsten Co., Ltd.) was used instead of the tantalum carbide powder.

When the bonded section of this susceptor 5 was observed by SEM, the placement plate 1, the support plate 3 and the feeding terminals 4 were bonded well.

Moreover, there was no occurrence of cracks in the bonded placement plate 1, support plate 3 and feeding terminals 4, and no peeling of the internal electrode 2 was observed.

Also, conduction between the feeding terminals 4 and the internal electrode 2 was excellent, and it was confirmed that these were reliably connected electrically.

Example 4

A susceptor 5 in Example 4 was obtained in the same manner as in Example 2, except that silicon carbide powder (average particle diameter: 0.05 µm, manufactured by Sumitomo Osaka Cement Co., Ltd.) was used instead of the tantalum carbide powder, and the mixed powder composition was such that the alumina powder was 90 parts by weight and the silicon carbide powder was 10 parts by weight.

When the bonded section of this susceptor 5 was observed by SEM, the placement plate 1, the support plate 3 and the feeding terminals 4 were bonded well.

Moreover, there was no occurrence of cracks in the bonded placement plate 1, support plate 3 and feeding terminals 4, and no peeling of the internal electrode 2 was observed.

Also, conduction between the feeding terminals 4 and the internal electrode 2 was excellent, and it was confirmed that these were reliably connected electrically.

What is claimed is:

1. A built-in electrode type susceptor comprising a placement plate for placing a plate sample thereon, a support plate for supporting this placement plate, an internal electrode provided between these placement plate and support plate so as not to come in contact with the outside, and a feeding terminal consisting of a composite conductive ceramic sintered body or formed of a sintered body or a casting of a refractory metal, fitted and fixed in a fixation hole so as to penetrate through said support plate and to come in contact with the internal electrode, wherein said placement plate and said support plate are integrally bonded by a nonconductive material having the same composition or the same main component as that of the material constituting these plates.

2. A built-in electrode type susceptor comprising a placement plate for placing a plate sample thereon, a support plate for supporting this placement plate, an internal electrode provided between these placement plate and support plate so as not to come in contact with the outside, and a feeding terminal fitted and fixed in a fixation hole so as to penetrate through said support plate so as to come in contact with the internal electrode, wherein said internal electrode and said feeding terminal are formed of a conductive ceramic.

3. A built-in electrode type susceptor according to claim 2, wherein said conductive ceramics is any one kind of composite ceramics conductors selected from an alumina-tantalum carbide composite ceramics conductor, an alumina-tungsten composite ceramics conductor, an alumina-silicon carbide composite ceramics conductor, an aluminum nitride-tungsten composite ceramics conductor, or an aluminum nitride-tantalum composite ceramics conductor.

4. A built-in electrode type susceptor according to claim 3, wherein said alumina-tantalum carbide composite ceramics conductor contains tantalum in an amount of from 54 to 71% by weight.

5. A built-in electrode type susceptor according to claim 3, wherein said alumina-tungsten composite ceramics conductor contains tungsten in an amount of from 54 to 95% by weight.

6. A built-in electrode type susceptor according to claim 3, wherein said alumina-silicon carbide composite ceramics conductor contains silicon carbide in an amount of from 5 to 30% by weight.

7. A built-in electrode type susceptor according to either one of claim 1 or 2, wherein said placement plate and said support plate comprise an alumina group sintered body or an aluminum nitride group sintered body.

8. A method of manufacturing a built-in electrode type susceptor comprising steps of:

preparing a plate-like placement plate and support plate from a ceramics sintered body;

forming a fixation hole for fixing a feeding terminal in the support plate;

fitting the feeding terminal in said fixation hole so as to penetrate through the support plate;

forming a conductive material layer serving as an internal electrode on said support plate holding the feeding terminal, so as to come in contact with the feeding terminal;

overlapping said support plate and said placement plate on each other via said conductive material layer, and subjecting these to sintering processing under application of pressure to thereby integrate these plates; and forming an internal electrode consisting of said conductive material layer between these support plate and placement plate.

9. A method of manufacturing a built-in electrode type susceptor according to claim 8, wherein when the support plate and the placement plate are overlapped on each other, a nonconductive material layer comprising a powdery material having the same composition or the same main component as that of the ceramics sintered body constituting said placement plate and said support plate is formed in an area other than the area where said conductive material layer is formed on the support plate.

10. A method of manufacturing a built-in electrode type susceptor according to either one of claim 8 and claim 9, wherein as the conductive material serving as the internal electrode or the feeding terminal, any one kind selected from an alumina-tantalum carbide composite ceramics conductive material, an alumina-tungsten composite ceramics conductive material, an alumina-silicon carbide composite ceramics conductive material, an aluminum nitride-tungsten composite ceramics conductive material, an aluminum nitride-tantalum composite ceramics conductive material, or a high melting metal is used.

* * * * *